(12) United States Patent
Arvin et al.

(10) Patent No.: US 11,009,545 B2
(45) Date of Patent: May 18, 2021

(54) INTEGRATED CIRCUIT TESTER PROBE CONTACT LINER

(71) Applicant: International Business Machines Corporation, Armonk, NY (US)

(72) Inventors: Charles L. Arvin, Poughkeepsie, NY (US); David M. Audette, Colchester, VT (US); Dennis R. Conti, Essex Junction, VT (US); Brian M. Erwin, Millbrook, NY (US); Grant Wagner, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/816,841

(22) Filed: Mar. 12, 2020

(65) Prior Publication Data

US 2020/0209308 A1 Jul. 2, 2020

Related U.S. Application Data

(63) Continuation of application No. 15/979,853, filed on May 15, 2018, now Pat. No. 10,670,653.

(51) Int. Cl.
*G01R 31/28* (2006.01)
*B23K 26/26* (2014.01)
*G01R 1/067* (2006.01)

(52) U.S. Cl.
CPC ......... *G01R 31/2889* (2013.01); *B23K 26/26* (2013.01); *G01R 1/06761* (2013.01); *G01R 31/2896* (2013.01)

(58) Field of Classification Search
None
See application file for complete search history.

(56) References Cited

U.S. PATENT DOCUMENTS

| | | | |
|---|---|---|---|
| 4,270,823 A | 6/1981 | Kuznetzoff | |
| 4,333,467 A | 6/1982 | Domicone | |
| 5,527,591 A | 6/1996 | Crotzer et al. | |
| 5,642,055 A | 6/1997 | DiFrancesco | |
| 5,929,521 A | 7/1999 | Wark et al. | |
| 6,043,670 A | 3/2000 | Degani et al. | |
| 6,072,324 A | 6/2000 | Farnworth | |
| 6,348,392 B1 | 2/2002 | Nakayama et al. | |
| 6,437,591 B1 | 8/2002 | Farnworth et al. | |
| 6,518,781 B2 | 2/2003 | Masuda | |
| 6,633,176 B2 | 10/2003 | Takemoto et al. | |
| 6,846,735 B1 | 1/2005 | Lin et al. | |
| 2004/0119579 A1* | 6/2004 | Takehana | H01C 1/148 338/20 |
| 2011/0279137 A1* | 11/2011 | Pagani | G01R 1/06761 324/754.03 |
| 2012/0318023 A1 | 12/2012 | Shimomura | |
| 2012/0319092 A1 | 12/2012 | Shimomura | |

OTHER PUBLICATIONS

List of IBM Patents or Patent Applications Treated as Related, filed herewith.

* cited by examiner

*Primary Examiner* — Jas A Sanghera
(74) *Attorney, Agent, or Firm* — ZIP Group PLLC (57) ABSTRACT

An integrated circuit (IC) device tester includes contact probes. A liner is formed upon the contact probes. The liner includes a matrix of metal particles and glass particles. The metal particles of the liner allow the contact probe to pass an electrical current through the liner. The glass particles of the liner prevent C4 material from adhering to the liner.

20 Claims, 8 Drawing Sheets

INTEGRATED CIRCUIT TESTER PROBE CONTACT LINER

FIELD

Embodiments of invention generally relate to integrated circuit (IC) device testers, such as a wafer prober, that include probe contacts. More particularly, embodiments relate to fabricating a liner upon probe contacts of the IC device tester.

BACKGROUND

An IC device tester is a system used for electrical testing of IC devices, such as dies, wafers, or the like. Test signals from the IC device tester are transmitted to the IC device by way of contact probes that are upon a probe card and the test signals are then returned from the IC device for analysis. After the test, the contact probes are forced away from contacts of the IC device.

SUMMARY

In an embodiment of the present invention, a probe card is presented. The probe card includes a probe contact and a conductive glass matrix liner upon the probe contact. The conductive matrix liner consists essentially of glass particles and metal particles. The glass particles have a mass percent range between five percent and fifty percent relative to a mass of the metal particles.

In another embodiment of the present invention, an integrated circuit (IC) device testing system is presented. The IC device testing system includes an IC device tester that passes an outgoing electrical current from a probe contact through a conductive glass matrix liner that surrounds the probe contact and receives a return electrical current at the probe contact through the conductive glass matrix liner. The conductive matrix liner consists essentially of glass particles and metal particles. The glass particles have a mass percent range between five percent and fifty percent relative to a mass of the metal particles.

In yet another embodiment of the present invention, a wafer testing system is presented. The system includes a probe card that includes a probe contact. The probe contact includes a conductive glass matrix liner upon and surrounding exterior surfaces of the probe contact. The conductive matrix liner consists essentially of glass particles and metal particles. The glass particles have a mass percent range between five percent and fifty percent relative to a mass of the metal particles.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention relate to a liner upon a probe contact. The liner includes a matrix of an electrical conductor and glass. The liner includes a matrix of metal particles and glass particles. The metal particles of the liner allow the contact probe to pass an electrical current through the liner. The glass particles of the liner prevent C4 material from adhering to the liner.

Referring now to the figures, wherein like components are labeled with like numerals, exemplary structures of a semiconductor device, in accordance with embodiments of the present invention are shown and will now be described in greater detail below. The specific number of components depicted in the figures and the cross-section orientation was chosen to best illustrate the various embodiments described herein.

Figure 1:
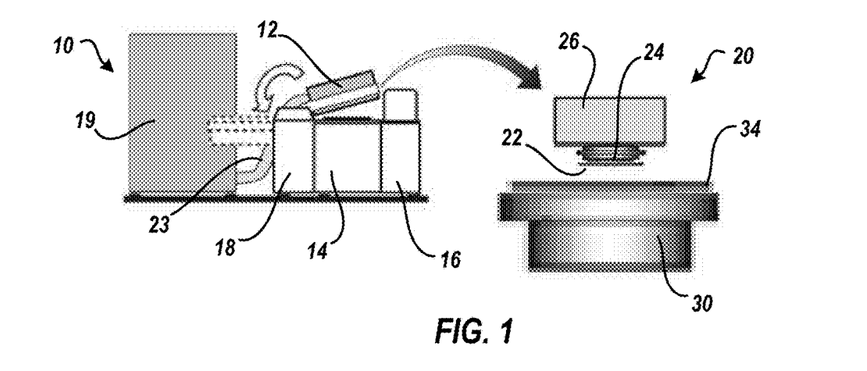
FIG. 1 depicts views of an exemplary IC device tester which may implement one or embodiments of the present invention.

FIG. 1 depicts views of an exemplary IC device tester 10 which may implement one or embodiments of the present invention. IC device tester 10 may include a head assembly housing 12, a wafer chuck housing 14, a wafer housing 16, a wafer housing 18, an analyzer 19, and a cable 23. Head assembly housing 12 may be rotatable relative to wafer chuck housing 14, wafer housing 16, a wafer housing 18. Head assembly housing 12 includes head assembly 20. Wafer chuck housing 14 includes wafer chuck 30 and may also include a robotic arm that moves a wafer 34 from wafer housing 16 to wafer chuck 30 and from wafer chuck 30 to wafer housing 18.

Head assembly 20 may include a probe card 22, a probe head 24, and a head body 26. To conduct a test of wafer 34, contact probes of the probe card 22 electrically contact wafer 34 contacts. The head assembly 20 may be moveably relative to wafer chuck 30. As such, the probe card 22 may test one die of wafer 34 and, subsequently, wafer chuck 30 may move and the probe card 22 may test a different die of wafer 34. Probe head 24 electrically connects the probe card 22 to the head body 26.

Test signals from the IC device tester 10 are transmitted from the analyzer 19 by cable 23 to the head body 26. These test signals are then transferred from the head body 26 to the probe head 24, to the probe card 22, to the contact probes of probe card 22, and ultimately to the contacts of wafer 34. The test signals are then returned from wafer 34 to analyzer 19 for analysis.

Once the test of the wafer 34 is completed, the tested wafer 34 may be moved into wafer housing 18, and a new wafer may be moved from wafer housing 16 to chuck 30 for testing.

Figure 2:
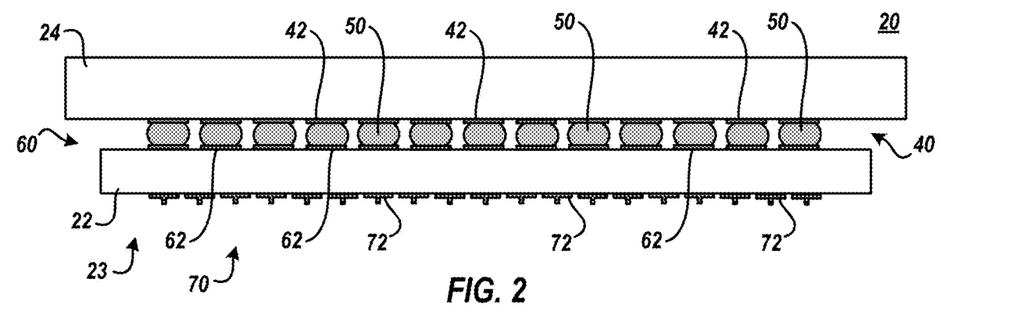
FIG. 2 depicts a cross section view of head assembly components of an IC device tester, in accordance with one or more embodiments of the present invention.

FIG. 2 depicts a cross section view of head assembly 20 components of IC device tester 10, in accordance with one or more embodiments of the present invention. More specifically, FIG. 2 depicts probe card 22 and probe head 24. Probe head 24 may include a contact grid 40 of contacts 42. Grid 40 may be organized into rows and columns of contacts 42. Grid 40 may be a square matrix of contacts 42.

Probe card 22 may include a contact grid 60 of contacts 62. Grid 60 may be organized into rows and columns of contacts 62. Grid 60 may be a square matrix of contacts 62. Grid 40 of contacts 42 may be electrically connected to the grid 60 of contacts 62 by interconnects 50. For example, a grid of interconnects 50 may electrically connect grid 40 and grid 60, as one interconnect 50 electrically connects one contact 42 with one contact 62. Interconnects 50 may be solder, pins, fuzzy buttons, posts, or the like.

Probe card 22 includes an IC device facing surface 23 that includes a grid 70 of probe contacts 72. Grid 70 may be organized into rows and columns of contacts 72. Grid 70 may be a square matrix of contacts 72. Grid 70 of contacts 72 may be electrically connected to grid 60 of contacts 62 by internal wiring within probe card 22. Contacts 72 may be formed upon probe card 22 by known fabrication techniques and may be formed from a conductive material, such as metal. In a particular embodiment, contacts 72 may be formed from copper.

Electrical pathways, that may be isolated relative to each other, exists from the analyzer 19, through cable 23, through the head body 26, through the probe head 24, through the probe card 22, to a particular contact probe 72 of probe card 22. The test signals may be sent from analyzer 19 to wafer 34 and returned from the wafer 34 to analyzer 19 by way of the electrical pathways.

Figure 3:
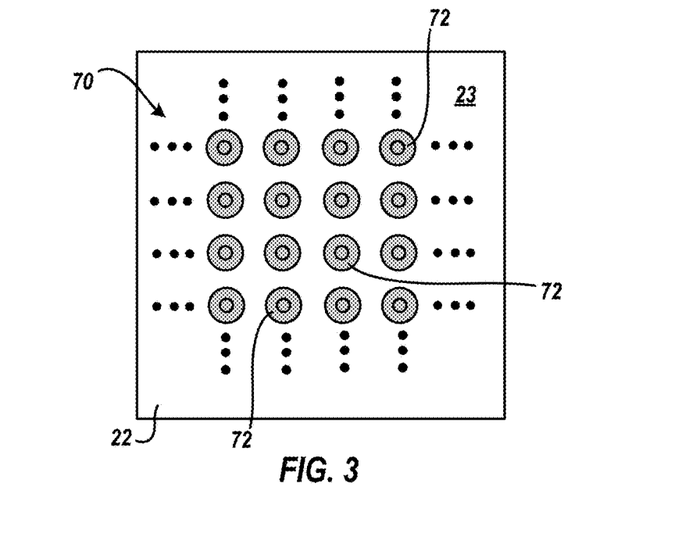
FIG. 3 depicts a normal view of a IC device facing surface of a probe card, in accordance with one or more embodiments of the present invention.

FIG. 3 depicts a normal view of IC device facing surface 23 of probe card 22, in accordance with one or more embodiments of the present invention. As depicted, grid 70 may be a square matrix organized by rows and columns of contacts 72. Though an exemplary number of contacts 72 are depicted, a greater or lesser number of contacts 72 may be included upon surface 23 of card 22. During testing, the probe contacts 72 of the probe card 22 may contact die contacts within one die. After testing the particular die 80, the probe card 22 may contact die contacts within a different die 80 to test that die 80. Such process may be repeated until all dies 80 of wafer 34 are tested.

Figure 4:
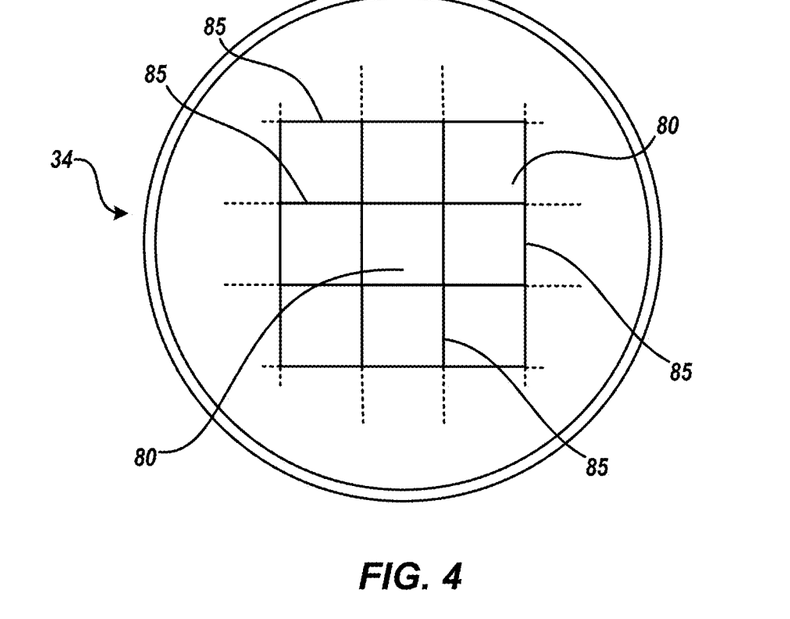
FIG. 4 depicts a normal view of a wafer, in accordance with one or more embodiments of the present invention.

FIG. 4 depicts a normal view of wafer 34, in accordance with one or more embodiments of the present invention. Wafer 34 may include a plurality of dies 80 separated by kerfs 85. Each die 80 may include an active region, wherein integrated circuit devices, microelectronic devices, etc. may be built using microfabrication process steps such as doping or ion implantation, etching, deposition of various materials, photolithographic patterning, electroplating, etc.

Figure 5:
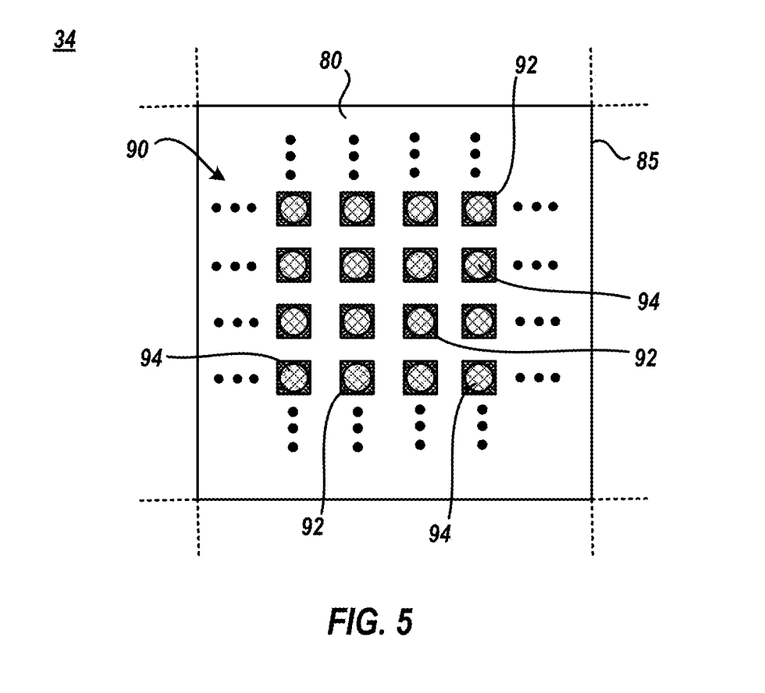
FIG. 5 depicts a detailed normal view of a wafer, in accordance with one or more embodiments of the present invention.

FIG. 5 depicts a detailed normal view of a die 80 of wafer 34, in accordance with one or more embodiments of the present invention. Each die 80 includes a grid 90 of contacts 92. Grid 90 may be organized into rows and columns of contacts 92. Grid 90 may be a square matrix of contacts 92. Controlled collapse chip connection (C4) material 94, such as solder, or the like, may be upon each contact 92. Though an exemplary number of contacts 92 are depicted, a greater or lesser number of contacts 92 may be included upon each die 80.

Figure 6:
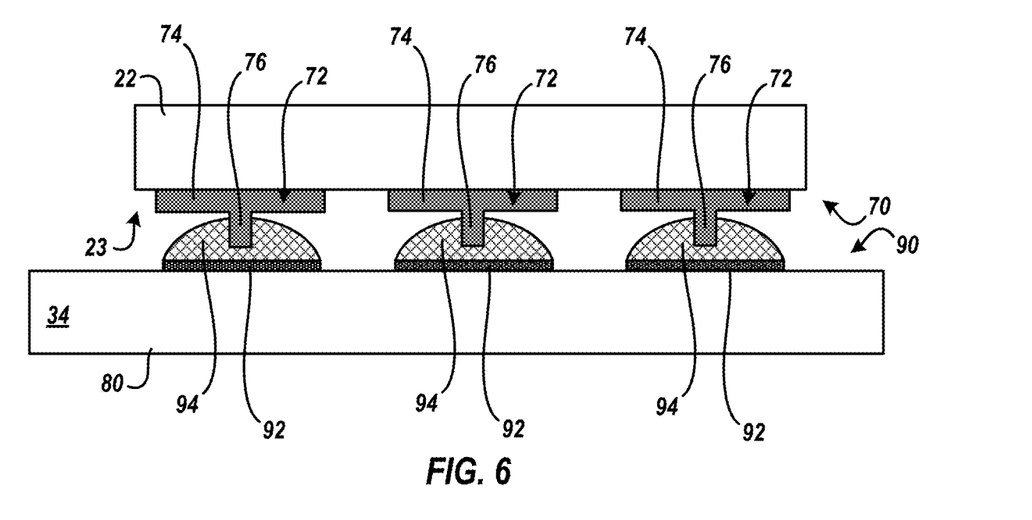
FIG. 6 depicts a cross section view of IC device tester probes in electrical contact with IC device contacts, in accordance with one or more embodiments of the present invention.

FIG. 6 depicts a cross section view of contact probes 72 in electrical contact with die 80 contacts 92, in accordance with one or more embodiments of the present invention. Contact probe 72 may include a base portion 74 and a tip portion 76. Tip portion 76 generally has a diameter less than the diameter than base portion 74. Tip portion 76 may protrude from base portion 74 and may share a same bisector axis that is normal to the IC device facing surface 23 of card 22. To test the die 80 of wafer 34, wafer chuck 30 moves the wafer 34 toward the head assembly 20 such that the contacts 90 are aligned with probe contacts 72. Subsequently, the wafer 34 is forced into head assembly 20 and the probe contacts 72 contact at least the C4 material 94 of contacts 92. Probe contacts 72, C4 material 94, and contacts 92 are generally electrically conductive.

A first test signal may be sent from analyzer 19 by way of a first electrical pathway to a first probe contact 72 and into the die 80 by way of the associated electrically connected C4 material 94 and associated contact 92. The first test signal may cross one or more integrated circuit devices, microelectronic devices, or the like, within die 80, thereby becoming a first return signal. The first test return signal may be received by analyzer 19 by way of the first electrical pathway from the first probe contact 72 or from a different electrical pathway associated with a contact 72 different from the first contact 72. A second test signal may be sent from analyzer 19 by way of a second electrical pathway to a second probe contact 72 and into the die 80 by way of the associated electrically connected C4 material 94 and associated contact 92. The second test signal may cross one or more integrated circuit devices, microelectronic devices, or the like, within die 80, thereby becoming a second return signal. The second test return signal may be received by analyzer 19 by way of the second electrical pathway from the first probe contact 72 or from a different pathway associated with a contact 72 different from the second contact 72. The first test signal and the second test signal may be sent and/or received by or from analyzer 19 simultaneously.

Figure 7:
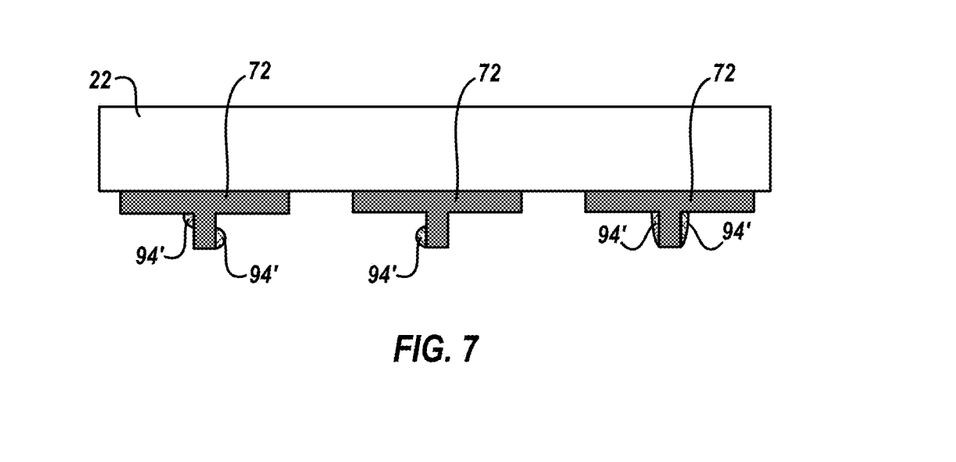
FIG. 7 depicts residual IC device contact material upon IC device tester probes, in accordance with one or more embodiments of the present invention.

FIG. 7 depicts residual IC device contact material 94' upon IC device tester probes 72, in accordance with one or more embodiments of the present invention. After testing wafer 34 and/or testing die 80, head assembly 20 is forced away from wafer 34 causing probe contacts 72 to separate from wafer 34 and/or die 80. In some instances, residual contact material 94' adheres to one or more probe contacts 72 and the residual contact material 94' is deposited or otherwise adhered to the probe contact(s) 72. Such residual contact material 94' upon the probe contact(s) 72 may contaminate the probe card 22 and may force the probe card 22 to be replaced with a probe card 22 without such residual contact material 94' upon its probe contact(s) 72.

Figure 8:
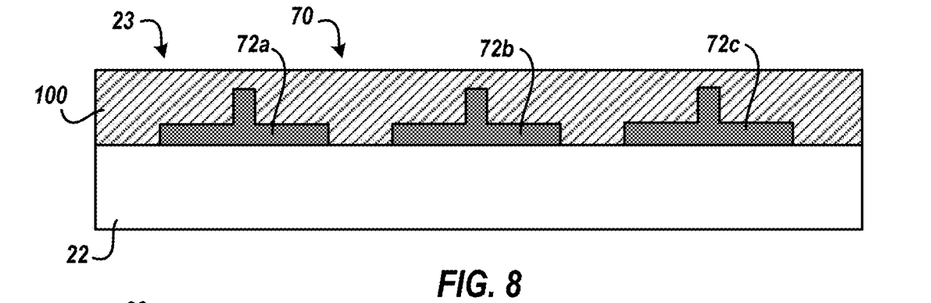
FIG. 8-FIG. 11 depict cross section views of probe card fabrication stages, in accordance with one or more embodiments of the present invention.

FIG. 8 depicts a cross section view of a probe card 22 fabrication stage, in accordance with one or more embodiments of the present invention. In the present fabrication state, a conductive glass frit 100 is formed upon probe card 22.

Conductive glass frit 100 is a material, such as a paste, that includes a glass powder, a conductive organic binder, and solvents. A low melting glass paste may be milled into powder (grain size<15 μm) and mixed with a conductive organic binder to form a printable or a sprayable viscous paste. A filler or fillers, such as but not limited to cordierite particles or barium silicate, may be added to influence properties, i.e. lowering the mismatch of thermal expansion coefficients between that of the probe card 22 and the conductive glass frit 100. The solvents may be used to adjust the material viscosity. The conductive organic binder may be an intrinsically conducting polymer.

The conductive glass frit 100 may be formed upon the probe head card 22 and probe contacts 72 by, for example, spraying, spin coating, or the like, a blanket conductive glass frit 100 layer upon probe card 22 and probe contacts 72 to a thickness greater than the probe contacts 72 to cover the probe card 22 and probe contacts 72. In other implementations, the conductive glass frit 100 may be formed locally upon just the probe contacts 72 by, for example, screen printing, or the like, the conductive glass frit 100 upon just the probe contacts 72.

Figure 9:
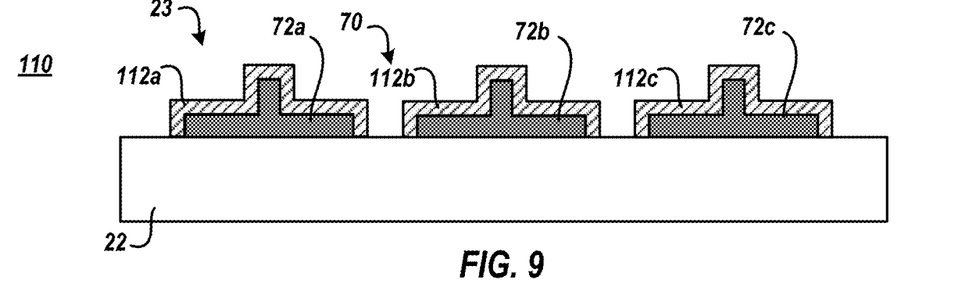

FIG. 9 depicts a cross section view of a probe card 22 fabrication stage, in accordance with one or more embodiments of the present invention. At the present fabrication stage, excess conductive glass frit 100 (if any) may be evaporated with an evaporation technique 110 while conductive glass frit 100 upon the probe contacts 72 is retained. For example, excess conductive glass frit 100 is evaporated and local conductive glass frit 112a is retained upon probe contact 72a, local conductive glass frit 112b is retained upon probe contact 72b, and local conductive glass frit 112c is retained upon probe contact 72c. The evaporation technique may be leaving the wafer 34 in an ambient or heated environment for a predetermined time to evaporate excess conductive glass frit 100 while pulling conductive glass frit 100 onto probe contacts 72 thereby forming local conductive glass frit 112a, 112b, 112c.

Figure 10:
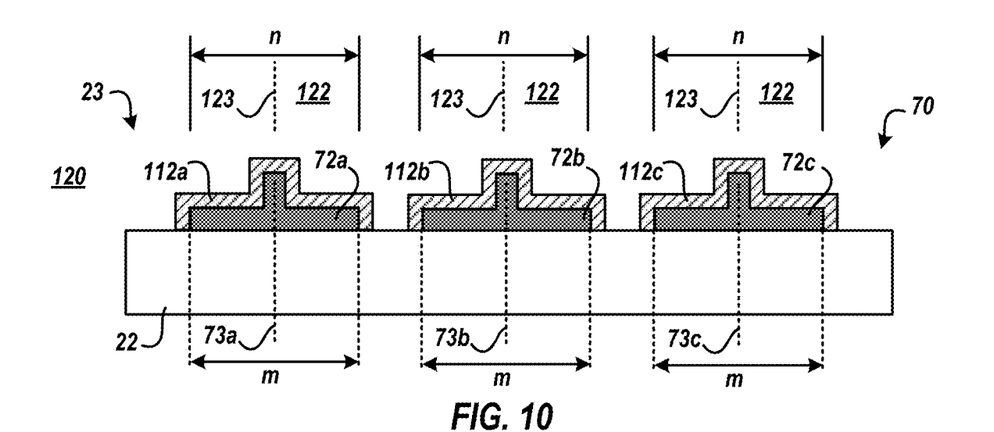

FIG. 10 depicts a cross section view of a probe card 22 fabrication stage, in accordance with one or more embodiments of the present invention. In the present fabrication stage, the local conductive glass frit upon probe contacts is thermally conditioned by a laser heating technique 120. For example, a laser is scanned across surface 23 of probe card 22 and a laser beam 122 is directed at each probe contact 72. The laser beam 122 may have a width "n" which is less than or equal to a width "m" of probe contact 72. The laser beam 122 may have a central bisector axis 123.

The laser beam 122 may directly thermally condition the local conductive glass frit upon the contact or may indirectly thermally condition the local conductive glass frit by directly heating the associated probe contact. For example, laser beam 122 may directly thermally condition the local conductive glass frit upon the contact if most of the laser beam 122 energy is absorbed by the local conductive glass frit. Alternatively, the laser beam 122 may indirectly thermally condition the local conductive glass frit upon the contact if the minority of the laser beam 122 energy is absorbed by the local conductive glass frit and most of the laser beam energy is absorbed by the associated contact.

Figure 11:
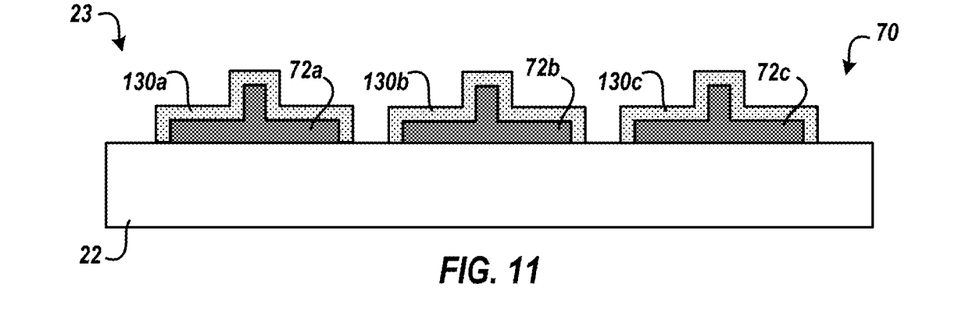

The laser may be scanned across surface 23 of probe card 22. When the laser is positioned above contact 72a, the laser directs the laser beam 122 at probe contact 72a such that the central bisector axis 123 is coincident with a central bisector axis 73a of probe contact 72a for a predetermined time to thermally condition the local conductive glass frit 112a to form conductive glass matrix 130a, as shown in FIG. 11. After thermally conditioning local conductive glass frit 112a, the laser may turn off the laser beam 122 and may be moved above contact 72b. Subsequently, the laser may direct the laser beam 122 at probe contact 72b such that the central bisector axis 123 is coincident with a central bisector axis 73b of probe contact 72b for the predetermined time to thermally condition local conductive glass frit 112b to form conductive glass matrix 130b, as shown in FIG. 11. After thermally conditioning local conductive glass frit 112b, the laser may turn off the laser beam 122 and may be moved above contact 72c. Subsequently, the laser may direct the laser beam 122 at probe contact 72c such that the central bisector axis 123 is coincident with a central bisector axis 73c of probe contact 72c for the predetermined time to thermally condition local conductive glass frit 112c to form conductive glass matrix 130c, as shown in FIG. 11. Such scanning technique may be used to thermally condition the local conductive glass frit upon each probe contact 72 within grid 70.

Thermal conditioning of the conductive glass frit transforms the conductive glass frit into a matrix of conductive organic material and glass, which may be referred to as conductive glass matrix, and forms a connection between the conductive glass matrix and the probe contact 72. The formation of the conductive glass matrix by these thermal conditioning techniques allows for the local thermal conditioning of conductive glass frit while subjecting the probe card 22 to minimal temperature increases such that the temperature of the probe card 22 is maintained to be below the critical temperature that damages the probe card. For example, if probe card 22 includes organic material, the critical temperature that damages such organics may be 200° C. Therefore, thermally conditioning technique by such laser heating technique 120 allows for the local thermal conditioning of conductive glass frit to form the conductive glass matrix (with local temperatures may reach 800° C.) while the temperature of probe card 22 is maintained below 200° C.

Thermally conditioning may include an initial stage of drying the conductive glass frit to diffuse solvents out of the interface of the conductive glass frit and the probe contact and to start polymerization of the conductive organic material to long-chain polymers. In another stage, the conductive glass frit may be further heated to a temperature where the glass powder has not fully melted to allow for outgassing. In another stage, the conductive glass frit is further heated to form glass interspersed with the polymerized conductive organic to form the conductive glass matrix.

FIG. 11 depicts a cross section view of a probe card 22 fabrication stage, in accordance with one or more embodiments of the present invention. In the present fabrication stage, the conductive glass frit has been thermally conditioned by the laser heating technique 120 depicted in FIG. 10 to thereby form conductive glass matrix 130. For example, conductive glass matrix 130a is formed upon probe contact 72a, conductive glass matrix 130b is formed upon probe contact 72b, and conductive glass matrix 130c is formed upon probe contact 72c.

The conductive glass matrix 130 upon the contact 72 may serve as a liner that is connected to the exterior surfaces of the probe contact 72. For example, conductive glass matrix 130a lines the sidewall surfaces and the IC device facing surfaces of the base portion and the tip portion of probe contact 72a, conductive glass matrix 130b lines the sidewall surfaces and the IC device facing surfaces of the base portion and the tip portion of probe contact 72b, and conductive glass matrix 130c lines the sidewall surfaces and the IC device facing surfaces of the base portion and the tip portion of probe contact 72c.

The conductive glass matrix 130 is composed of metal and glass particles. The mass percent of conductive glass matrix 130 can range from 5 to 50% glass, with a preferred glass percentage of 10%. The glass and/or metal particles may be on the order of 5 to 100 um in diameter, with a preferred diameter of 10 um. The thickness of conductive glass matrix 130 may be 25 to 1000 um. In a particular embodiment, the metal particles may be silver particles, or the like.

The metal within conductive glass matrix 130 is electrically connected in such a way that current can percolate through the conductive glass matrix 130. For example, the metal and glass particles within conductive glass matrix 130 may be randomly arranged in a lattice site configuration, where each lattice site is randomly occupied by a metal particle or by a glass particle. The probability of the lattice site being occupied by a metal particle is probably "c" and the probability of the lattice site being occupied by a glass particle is probably "1-c." At a low concentration "c," the metal particle sites are either isolated or form small clusters of nearest neighbor lattice sites. Two metal particle sites belong to the same cluster if they are connected by a part of nearest neighbor metal particle sites, and a current can flow between them. At low "c" values, the conductive glass matrix 130 is an insulator, since no conducting path connects opposite surfaces of the conductive glass matrix 130. At large "c" values, many conducing paths between opposite surfaces of the conductive glass matrix 130 exist, where current can flow, and conductive glass matrix 130 is a conductor. At some percolation threshold, a concentration "c" exists where for the first time current can percolate from one surface of the conductive glass matrix 130 to the opposite surface. As such, conductive glass matrix 130 has a threshold number of random lattice sites occupied by metal particles in conductive glass matrix 130 that current can percolate from one side of conductive glass matrix 130 to an opposite side of conductive glass matrix 130.

Figure 12:
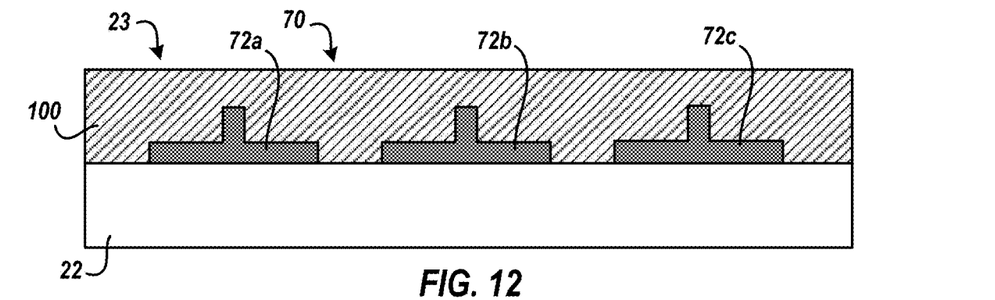
FIG. 12-FIG. 15 depict cross section views of probe card fabrication stages, in accordance with one or more embodiments of the present invention.

FIG. 12 depicts a cross section view of a probe card 22 fabrication stage, in accordance with one or more embodiments of the present invention. In the present fabrication state, a conductive glass frit 100 is formed upon probe card 22. The conductive glass frit 100 may be formed upon the probe card 22 and probe contacts 72 by, for example, spraying, spin coating, or the like, a blanket conductive glass frit 100 layer upon probe card 22 and probe contacts 72 to a thickness greater than the probe contacts 72 to cover the probe card 22 and probe contacts 72. In other implementations, the conductive glass frit 100 may be formed locally upon just the probe contacts 72 by, for example, screen printing, or the like, the conductive glass frit 100 upon just the probe contacts 72.

Figure 13:
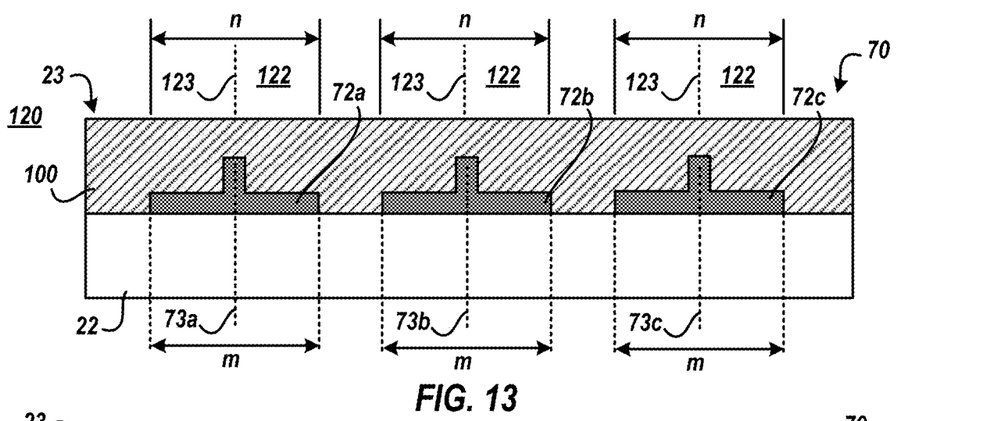

FIG. 13 depicts a cross section view of a probe card 22 fabrication stage, in accordance with one or more embodiments of the present invention. In the present fabrication stage, the conductive glass frit upon probe contacts is thermally conditioned by a laser heating technique 120 while excess conductive glass frit not upon probe contacts is retained. A laser may be moved to each probe contact 72 and a laser beam 122 is directed at each probe contact 72. The laser beam 122 may have a width "n" which is less than or equal to a width "m" of probe contact 72. The laser beam 122 may have a central bisector axis 123.

The laser may be scanned to sequentially thermally condition the conductive glass frit that is upon each contact 72 of the grid 70 of probe card 22. The laser may be positioned above contact 72a and the laser may direct the laser beam 122 at probe contact 72a such that the central bisector axis 123 is coincident with a central bisector axis 73a of probe contact 72a for a predetermined time to thermally condition the conductive glass frit that is nearest contact 72a. After thermally conditioning the conductive glass frit that is nearest contact 72a, the laser may turn off the laser beam 122 and may be moved above contact 72b. Subsequently, the laser may direct the laser beam 122 at probe contact 72b such that the central bisector axis 123 is coincident with a central bisector axis 73b of probe contact 72b for the predetermined time to thermally condition the conductive glass frit that is nearest contact 72b. After thermally conditioning the conductive glass frit that is nearest contact 72b, the laser may turn off the laser beam 122 and may be moved above contact 72c. Subsequently, the laser may direct the laser beam 122 at probe contact 72c such that the central bisector axis 123 is coincident with a central bisector axis 73c of probe contact 72c for the predetermined time to thermally condition the conductive glass frit that is nearest contact 72c. Such scanning technique may be used to thermally condition the local conductive glass frit upon each probe contact 72 within grid 70.

Figure 14:
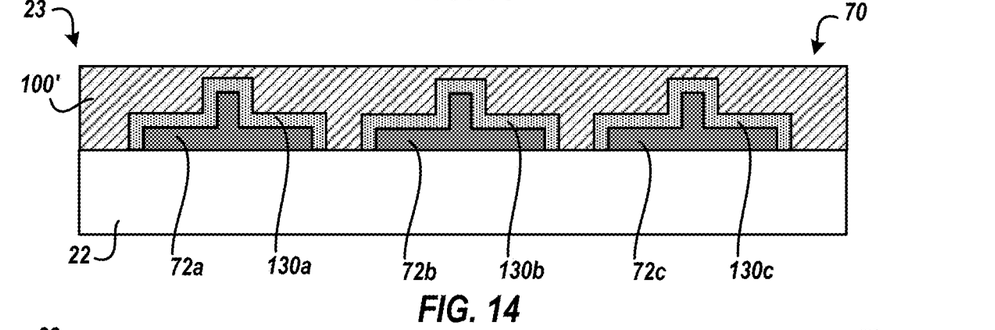

FIG. 14 depicts a cross section view of a probe card 22 fabrication stage, in accordance with one or more embodiments of the present invention. In the present fabrication stage, the conductive glass frit nearest the probe contacts 72 has been thermally conditioned by the laser heating technique 120 to form conductive glass matrix 130 upon the contacts 72 and excess conductive glass frit 100' further from the probe contacts 72 has been retained.

The laser beam 122 may directly thermally condition the conductive glass frit nearest the contact 72 or may indirectly thermally condition the conductive glass frit nearest the contact 72 by directly heating the probe contact 72. For example, laser beam 122 may directly thermally condition the conductive glass frit nearest the contact 72 and form conductive glass matrix 130 if most of the laser beam 122 energy is absorbed by this conductive glass frit while the excess conductive glass frit that is further from the probe contact does not receive adequate energy and does not reach a temperature for it to thermally condition into conductive glass matrix 130. As such, excess conductive glass frit 100' that is further from the probe contact is retained. Alternatively, the laser beam 122 may indirectly thermally condition the conductive glass frit nearest the contact 72 if most of the laser beam 122 energy is absorbed by the contact 72 thereby heating the contact 72 such that adequate heat transfers to the conductive glass frit that is nearest the contact 72 to form conductive glass matrix 130 while the excess conductive glass frit that is further from the probe contact 72 does not receive adequate heat transfer for it to thermally condition into conductive glass matrix 130 thereby retaining the excess conductive glass frit 100' that is further from probe contact 72. Each of the contacts 72 may have conductive glass matrix 130 formed thereupon. For example, conductive glass matrix 130a is formed upon contact 72a, conductive glass matrix 130b is formed upon contact 72b, and conductive glass matrix 130c is formed upon contact 72c.

Thermal conditioning of the conductive glass frit transforms the conductive glass frit into a matrix of conductive organic material and glass, which may be referred to as conductive glass matrix, and forms a connection between the conductive glass matrix and the probe contact 72. The formation of the conductive glass matrix by these thermal conditioning techniques allows for the local thermal conditioning of conductive glass frit while subjecting the probe card 22 to minimal temperature increase such that the temperature of the probe card 22 is maintained to be below the critical temperature that damages the probe card. For example, if probe card 22 includes organic material, the critical temperature that damages such organics may be 200° C. Therefore, thermally conditioning technique by such laser heating technique 120 allows for the local thermal conditioning of conductive glass frit to form the conductive glass matrix while the temperature of probe card 22 is maintained below 200° C.

Thermal conditioning may include an initial stage of drying the conductive glass frit to diffuse solvents out of the interface of the conductive glass frit and the probe contact and to start polymerization of the conductive organic material to long-chain polymers. In another stage, the conductive glass frit may be further heated to a temperature where the glass powder has not fully melted to allow for outgassing. In another stage, the conductive glass frit is further heated to form glass interspersed with the polymerized conductive organic to form the conductive glass matrix.

Figure 15:
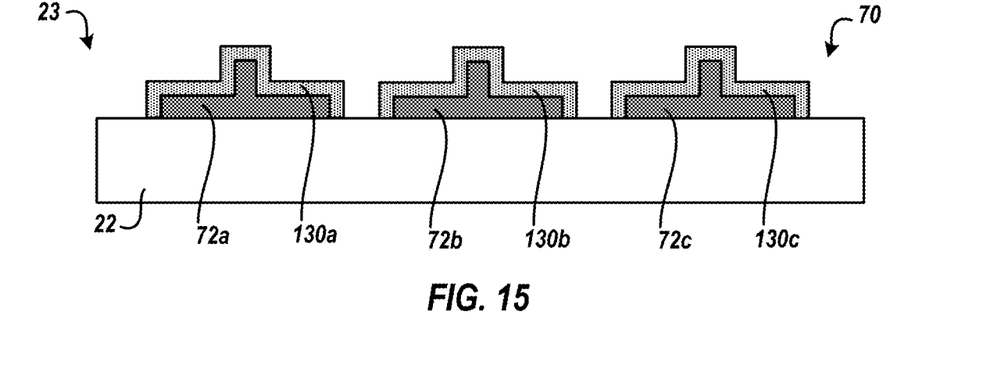

FIG. 15 depicts a cross section view of a probe card 22 fabrication stage, in accordance with one or more embodiments of the present invention. In the present fabrication stage, conductive glass matrix 130 upon the contacts 72 is retained and excess conductive glass frit 100' is removed. For example, conductive glass matrix 130a is retained upon probe contact 72a, conductive glass matrix 130b is retained upon probe contact 72b, and conductive glass matrix 130c is retained upon probe contact 72c while excess conductive glass frit 100' that did not thermally condition is removed.

The conductive glass matrix 130 upon the contact 72 may serve as a liner that is connected to the exterior surfaces of the probe contact 72. For example, conductive glass matrix 130a lines the sidewall surfaces and the IC device facing surfaces of the base portion and the tip portion of probe contact 72a, conductive glass matrix 130b lines the sidewall surfaces and the IC device facing surfaces of the base portion and the tip portion of probe contact 72b, and conductive glass matrix 130c lines the sidewall surfaces and the IC device facing surfaces of the base portion and the tip portion of probe contact 72c.

Figure 16:
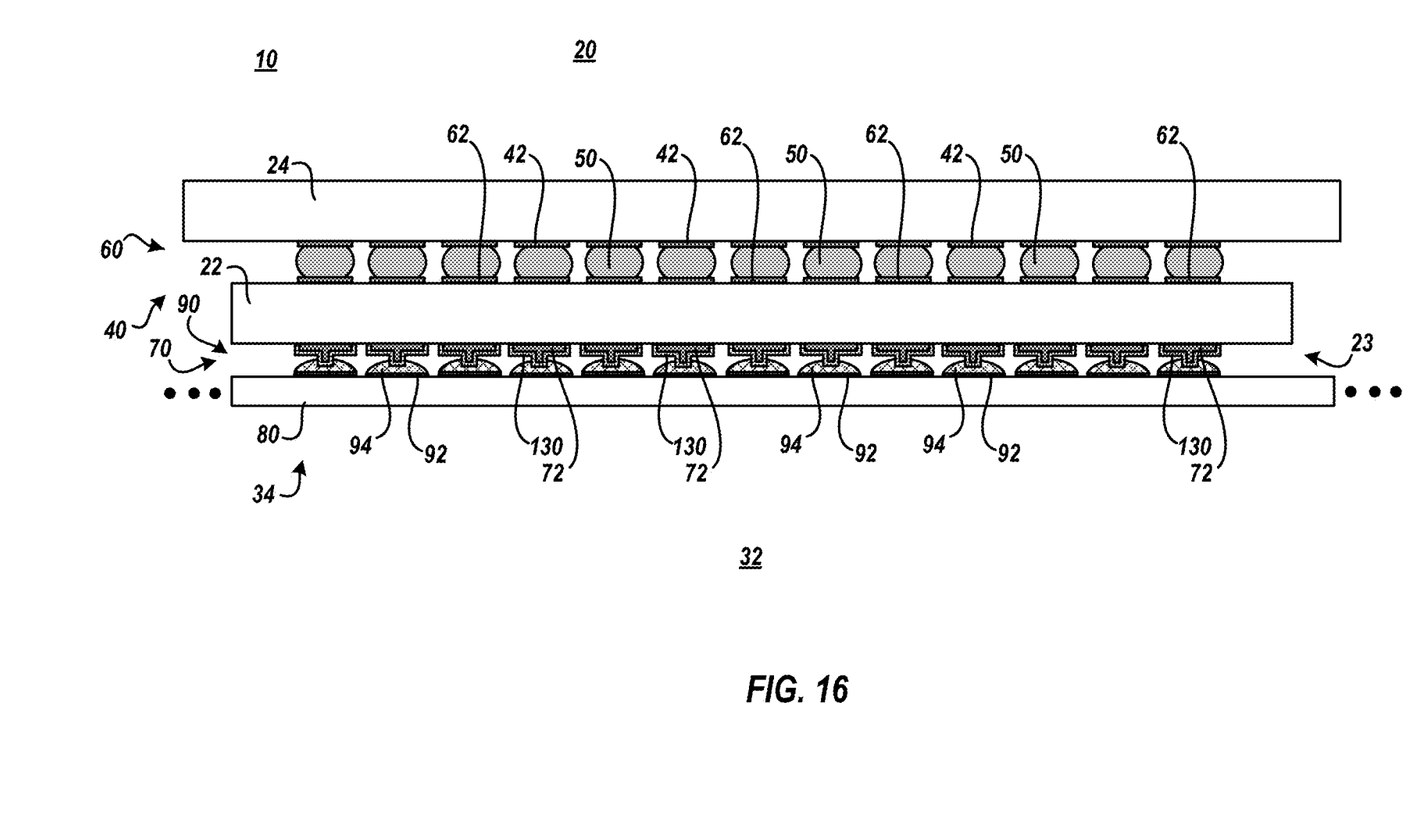
FIG. 16 depicts a cross section view of probe head components of an IC device tester, in accordance with one or more embodiments of the present invention.

FIG. 16 depicts a cross section view of head assembly 20 components of IC device tester 10, in accordance with one or more embodiments of the present invention. More specifically, FIG. 16 depicts probe card 22 and probe head 24. Probe head 24 may include a contact grid 40 of contacts 42. Grid 40 may be organized into rows and columns of contacts 42. Grid 40 may be a square matrix of contacts 42.

Probe card 22 includes an IC device facing surface 23 that includes a grid 70 of probe contacts 72 with a conductive glass matrix 130 liner upon each contact 72. The conductive glass matrix 130 liner upon contacts 72 allow for the electrical pathways, that may be isolated relative to each other, to exist from the analyzer 19, through cable 23, through the head body 26, through the probe head 24, through the probe card 22, through a particular contact probe 72 of probe card 22, and through the conductive glass matrix 130 liner upon the contact 72. The test signals may be sent from analyzer 19 to wafer 34 and returned from the wafer 34 to analyzer 19 by way of the respective electrical pathways.

A first test signal may be sent from analyzer 19 by way of a first electrical pathway to a first probe contact 72, through the first conductive glass matrix 130 liner thereupon, and into the die 80 by way of the associated electrically connected C4 material 94 and associated contact 92. The first test signal may cross one or more integrated circuit devices, microelectronic devices, or the like, within die 80, thereby becoming a first return signal. The first test return signal may be received by analyzer 19 by way of the first electrical pathway from the first probe contact 72 through its conductive glass matrix 130 liner or from a different electrical pathway associated with a contact 72 different from the first contact 72. A second test signal may be sent from analyzer 19 by way of a second electrical pathway to a second probe contact 72 through its conductive glass matrix 130 liner and into the die 80 by way of the associated electrically connected C4 material 94 and associated contact 92. The second test signal may cross one or more integrated circuit devices, microelectronic devices, or the like, within die 80, thereby becoming a second return signal. The second test return signal may be received by analyzer 19 by way of the second electrical pathway from the first probe contact 72 through its conductive glass matrix 130 liner or from a different pathway associated with a contact 72 different from the second contact 72. The first test signal and the second test signal may be sent and/or received by or from analyzer 19 simultaneously.

Figure 17:
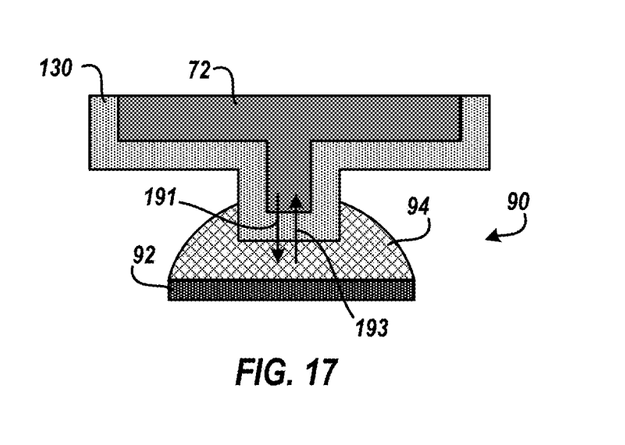
FIG. 17 depicts a cross section view of an IC device tester probe in electrical contact with an IC device contact, in accordance with one or more embodiments of the present invention.

FIG. 17 depicts a cross section view of an IC device tester probe contact 72 with a conductive glass matrix 130 liner in electrical contact with an IC device contact 90, in accordance with one or more embodiments of the present invention. To test the die 80 of wafer 34, wafer chuck 30 moves the wafer 34 toward the head assembly 20 such that the contact 90 is aligned with probe contact 72. Subsequently, the wafer 34 is forced into head assembly 20 and the conductive glass matrix 130 liner upon the probe contacts 72 contacts at least the C4 material 94 of contact 90. Conductive glass matrix 130 liner, probe contacts 72, C4 material 94, and contacts 92 are generally electrically conductive. Therefore, the electrical pathway contact 72 is maintained even though the contact 72 has the conductive glass matrix 130 liner formed thereupon.

An incoming electrical current 191 from analyzer 19 is passed from contact 72 through glass matrix 130 liner to probe contact 90 and into the die. The incoming electrical current 191 may cross one or more integrated circuit devices, microelectronic devices, or the like, within the die, thereby becoming return electrical current 193. The return electrical current 193 is passed from contact 90 to the probe contact 72 through conductive glass matrix 130 liner to analyzer 19.

Figure 18:
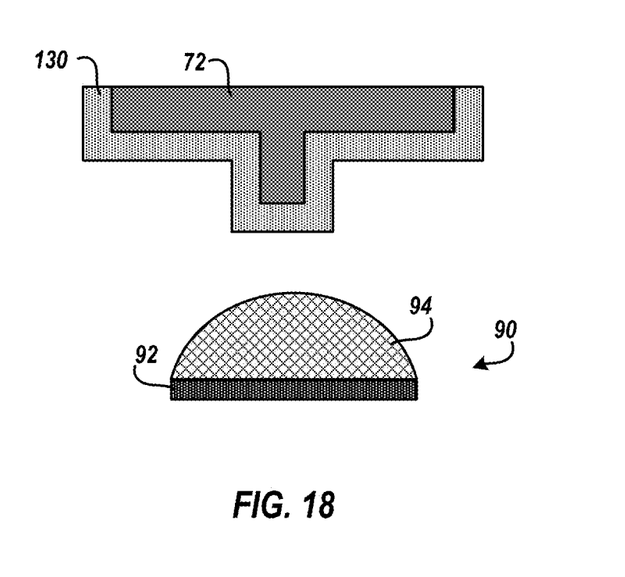
FIG. 18 depicts a cross section view of an IC device tester probe separated from an IC device contact, in accordance with one or more embodiments of the present invention.

FIG. 18 depicts a cross section view of an IC device tester probe separated from an IC device contact, in accordance with one or more embodiments of the present invention. After testing wafer 34 and/or testing die 80, head assembly 20 is forced away from wafer 34 causing probe contact 72 to separate from wafer 34 and/or die 80. Due to the glass within conductive glass matrix 130 liner, contact material 94 does not adhere to or is relatively less likely to adhere to the conductive glass matrix 130 liner upon the probe contact 72, and no residual contact material or relatively less contact material is deposited or otherwise adhered to the conductive glass matrix 130 liner. As such, less residual contact material upon the conductive glass matrix 130 liner of probe contact 72 less frequently contaminates the probe card 22 and thereby allows the probe card 22 to be replaced less frequently thereby extending the useful life of the probe card 22.

Figure 19:
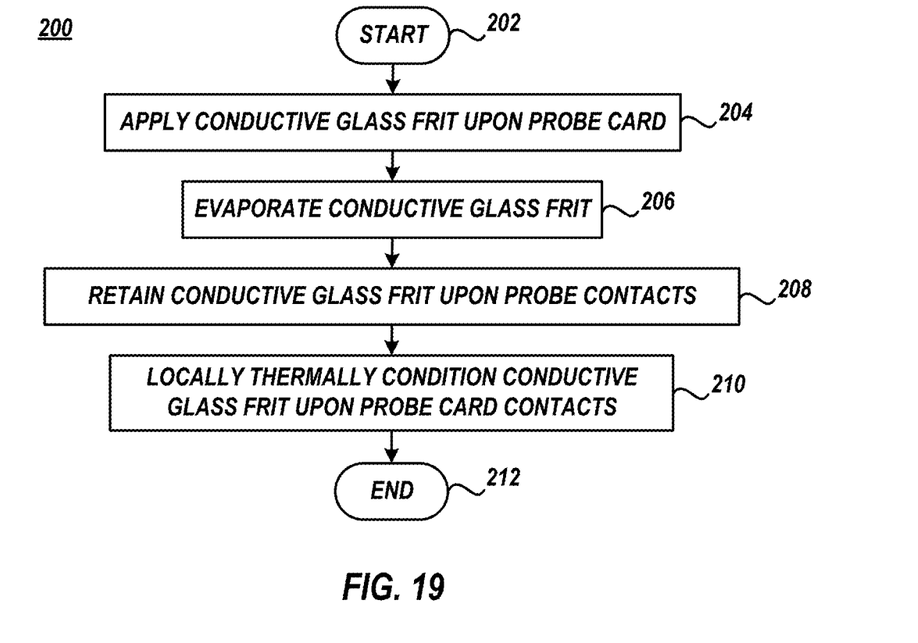
FIG. 19 depicts an exemplary method of fabricating an IC device tester probe card, in accordance with one or more embodiments of the present invention.

FIG. 19 depicts an exemplary method 200 of fabricating an IC device tester probe card 22, in accordance with one or more embodiments of the present invention. Method 200 may begin at block 202 and continue with applying conductive glass frit 100 upon the IC device facing surface 23 of probe card 22 and upon grid 70 of probe contacts 72 (block 204). The conductive glass frit 100 may be formed by spraying, spin coating, or the like, conductive glass frit 100 upon IC device facing surface 23 of probe card 22 and upon grid 70 of probe contacts 72. Alternatively, the conductive glass frit 100 may be formed by screen printing conductive glass frit 100 locally upon just the probe contacts 72.

Method 200 may continue with evaporating excess conductive glass frit 100 material (block 206) and retaining conductive glass frit 112 that is juxtaposed upon the probe contacts 72 (block 208). For example, an evaporation technique 110 may evaporate excess conductive glass frit 100 material by drawing in remaining conductive glass frit to the probe contacts 72 to form conductive glass frit 112 thereupon.

Method 200 may continue with locally thermally conditioning the conductive glass frit 112 that is upon the probe contact 72 (block 210). For example, a laser heating technique 120 may locally thermally condition the conductive glass frit 112 that is upon each probe contact 72 within the grid 70 to form the glass matrix 130 liner upon each contact 72 without subjecting the probe card to temperatures above the critical temperature that damage the probe card 22. Method 200 may end at block 212.

Figure 20:
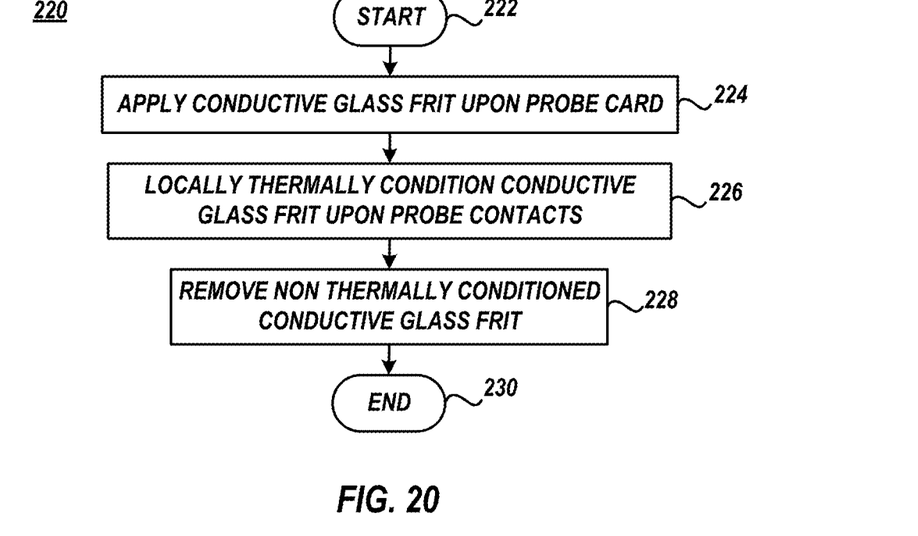
FIG. 20 depicts an exemplary method of fabricating an IC device tester probe card, in accordance with one or more embodiments of the present invention.

FIG. 20 depicts an exemplary method 220 of fabricating an IC device tester probe card 22, in accordance with one or more embodiments of the present invention. Method 220 may begin at block 222 and continue with applying conductive glass frit 100 upon the IC device facing surface 23 of probe card 22 and upon grid 70 of probe contacts 72 (block 224). The conductive glass frit 100 may be formed by spraying, spin coating, or the like, conductive glass frit 100 upon IC device facing surface 23 of probe card 22 and upon grid 70 of probe contacts 72. Alternatively, the conductive glass frit 100 may be formed by screen printing conductive glass frit 100 locally upon just the probe contacts 72.

Method 220 may continue with thermally conditioning the conductive glass frit 100 that is nearest the contact 72 while retaining non-thermally conditioned conductive glass frit 100 further away from the contact 72 (block 226). For example, a laser heating technique 120 may thermally condition the conductive glass frit 100 at the interface of each probe contact 72 within the grid 70 to form the glass matrix 130 liner upon each contact 72 without subjecting the probe card to temperatures above the critical temperature that damage the probe card 22 while excess conductive glass frit 100' that is further away from the contacts 72 is retained.

Method 220 may continue with removing the non-thermally conditioned conductive glass frit 100 (block 228). For example, the excess conductive glass frit 100' that has not been thermally conditioned because of its relative further distance from the contacts 72 is removed or washed away thereby leaving the glass matrix 130 liner upon each contact 72. Method 220 may end at block 230.

The accompanying figures and this description depicted and described embodiments of the present invention, and features and components thereof. Those skilled in the art will appreciate that any nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

References herein to terms such as "vertical", "horizontal", etc. are made by way of example, and not by way of limitation, to establish a frame of reference. The term "horizontal" as may be used herein is defined as a plane parallel to the conventional plane or surface of probe card 22, regardless of the actual spatial orientation of the probe card 22. The term "vertical" refers to a direction perpendicular to the horizontal, as just defined. Terms, such as "on", "above", "below", "side" (as in "sidewall"), "higher", "lower", "over", "beneath," "under", "top," "bottom," "left," "right," or the like, are used with respect to the horizontal plane. It is understood that various other frames of reference may be employed for describing the present invention without departing from the spirit and scope of the present invention.

What is claimed is:

1. A probe card comprising:
    a probe contact;
    a conductive glass matrix liner upon the probe contact, the conductive glass matrix liner consisting essentially of glass particles and metal particles, the glass particles and the metal particles randomly located in a lattice site, wherein the glass particles have a mass percent range between five percent and fifty percent relative to a mass of the metal particles.

2. The probe card of claim 1, wherein the conductive glass matrix liner comprises a first threshold number of lattice sites that contain a metal particle such that a conductive pathway is formed though a thickness of the conductive glass matrix liner.

3. The probe card of claim 2, wherein the first threshold number of lattice sites allow current to flow from the probe contact entirely through the conductive glass matrix liner.

4. The probe card of claim 1, wherein the conductive glass matrix liner comprises lattice sites that each include a glass particle (glass lattice sites) at a surface of the conductive glass matrix liner that opposes the probe contact.

5. The probe card of claim 4, wherein glass lattice sites prevent C4 material from adhering to the conductive glass matrix liner.

6. The probe card of claim 1, wherein the metal particles are Silver particles.

7. The probe card of claim 1, wherein the conductive glass matrix liner comprises one or more clusters of neighboring lattice sites that are each occupied by a metal particle.

8. An integrated circuit (IC) device testing system comprising:
- an IC device tester that passes an outgoing electrical current from a probe contact through a conductive glass matrix liner that surrounds the probe contact and receives a return electrical current at the probe contact through the conductive glass matrix liner, the conductive glass matrix liner consisting essentially of glass particles and metal particles, the glass particles and the metal particles randomly located in a lattice site, wherein the glass particles have a mass percent range between five percent and fifty percent relative to a mass of the metal particles.

9. The IC testing system of claim 8, wherein the conductive glass matrix liner comprises a first threshold number of lattice sites that contain a metal particle such that a conductive pathway is formed though a thickness of the conductive glass matrix liner.

10. The IC testing system of claim 9, wherein the first threshold number of lattice sites allow current to flow from the probe contact entirely through the conductive glass matrix liner.

11. The IC testing system of claim 8, wherein the conductive glass matrix liner comprises lattice sites that each include a glass particle (glass lattice sites) at a surface of the conductive glass matrix liner that opposes the probe contact.

12. The IC testing system of claim 11, wherein glass lattice sites prevent C4 material from adhering to the conductive glass matrix liner.

13. The IC testing system of claim 8, wherein the metal particles are Silver particles.

14. The IC testing system of claim 8, wherein the conductive glass matrix liner comprises one or more clusters of neighboring lattice sites that are each occupied by a metal particle.

15. A wafer testing system comprising:
- a probe card comprising a probe contact, the probe contact comprising a conductive glass matrix liner upon and surrounding exterior surfaces of the probe contact, the conductive glass matrix liner consisting essentially of glass particles and metal particles, the glass particles and the metal particles randomly located in a lattice site, wherein the glass particles have a mass percent range between five percent and fifty percent relative to a mass of the metal particles.

16. The wafer testing system of claim 15, wherein the conductive glass matrix liner comprises a first threshold number of lattice sites that contain a metal particle such that a conductive pathway is formed though a thickness of the conductive glass matrix liner.

17. The wafer testing system of claim 16, wherein the first threshold number of lattice sites allow current to flow from the probe contact entirely through the conductive glass matrix liner.

18. The wafer testing system of claim 15, wherein the conductive glass matrix liner comprises lattice sites that each include a glass particle (glass lattice sites) at a surface of the conductive glass matrix liner that opposes the probe contact and wherein the glass lattice sites prevent C4 material from adhering to the conductive glass matrix liner.

19. The wafer testing system of claim 15, wherein the metal particles are Silver particles.

20. The wafer testing system of claim 15, wherein the conductive glass matrix liner comprises one or more clusters of neighboring lattice sites that are each occupied by a metal particle.

* * * * *